(12) United States Patent
Ma et al.

(10) Patent No.: US 8,859,893 B2
(45) Date of Patent: Oct. 14, 2014

(54) LIGHT COLLECTION MODULE AND SOLAR ENERGY DEVICE HAVING THE SAME

(75) Inventors: Jyh-Yeuan Ma, Taoyuan County (TW); Chong-Yang Fang, Taichung (TW); Tsung-Yen Hsieh, Taichung (TW)

(73) Assignees: Dongguan Masstop Liquid Crystal Display Co., Ltd., Guangdong Province (CN); Wintek Corporation, Taichung (TW)

( * ) Notice: Subject to any disclaimer, the term of this patent is extended or adjusted under 35 U.S.C. 154(b) by 63 days.

(21) Appl. No.: 13/370,298

(22) Filed: Feb. 9, 2012

(65) Prior Publication Data

US 2012/0204945 A1  Aug. 16, 2012

(30) Foreign Application Priority Data

Feb. 11, 2011 (TW) .............................. 100104583 A

(51) Int. Cl.
*H01L 31/0232* (2014.01)
*H01L 31/04* (2014.01)
*H01L 31/02* (2006.01)
H01L 31/0236 (2006.01)
H01L 31/052 (2014.01)

(52) U.S. Cl.
CPC ............ *H01L 31/0522* (2013.01); *H01L 31/02* (2013.01); *Y02E 10/52* (2013.01)
USPC .......................................... 136/259; 136/246

(58) Field of Classification Search
CPC ............ H01L 31/0522; H01L 31/0524; H01L 31/052
USPC .......................................... 136/246, 256, 259
See application file for complete search history.

(56) References Cited

U.S. PATENT DOCUMENTS

| 2009/0129210 | A1* | 5/2009 | Yamaguchi et al. | 368/205 |
| 2010/0024866 | A1* | 2/2010 | Durvasula et al. | 136/246 |
| 2010/0139769 | A1* | 6/2010 | Mapel | 136/259 |
| 2011/0114174 | A1* | 5/2011 | Rennig et al. | 136/257 |
| 2012/0167951 | A1* | 7/2012 | Maeda et al. | 136/246 |

FOREIGN PATENT DOCUMENTS

| TW | M300793 | 11/2006 | | |
| TW | 200937655 | 9/2009 | | |
| TW | 200944729 | 11/2009 | | |
| TW | 201001735 | 1/2010 | | |
| TW | 201019485 | 5/2010 | | |
| WO | WO2009024509 | * | 2/2009 | 136/257 |
| WO | WO2011062020 | * | 5/2011 | 368/205 |

* cited by examiner

*Primary Examiner* — Jonathan Johnson
*Assistant Examiner* — Bethany Lambright
(74) *Attorney, Agent, or Firm* — Jianq Chyun IP Office

(57) ABSTRACT

A light collection module and a solar energy device are provided. The light collection module includes a light guiding material and a solar energy receiving element. The light guiding material has a first surface and a second surface opposite thereto. The first surface includes a first light guiding structure and a second light guiding structure. The first light guiding structure includes a first light guiding surface and a first auxiliary surface connected to each other and intersected in a first angle. The second light guiding structure includes a second light guiding surface and a second auxiliary surface connected to each other and intersected in a second angle. The inclination directions of the first and the second light guiding surfaces are opposite to each other. The solar energy receiving element is disposed on the first surface or the second surface.

10 Claims, 5 Drawing Sheets

LIGHT COLLECTION MODULE AND SOLAR ENERGY DEVICE HAVING THE SAME

CROSS-REFERENCE TO RELATED APPLICATION

This application claims the priority benefit of Taiwan application serial no. 100104583, filed on Feb. 11, 2011. The entirety of the above-mentioned patent application is hereby incorporated by reference herein and made a part of this specification.

BACKGROUND OF THE INVENTION

1. Field of the Invention

The invention relates to a light collection module. More particularly, the invention relates to a thin-volume light collection module and a solar energy device having the same.

2. Description of Related Art

Solar energy is an energy having the characteristics of never exhausted and no pollution. Therefore, solar energy draws more and more attention when the pollution problem and the storage shortage of the petrochemical energy are getting worse. Solar cell capable of directly transforming the solar energy into electrical energy thus becomes an important developing product.

In the known technique, the solar cell is configured on the sidewall of a light guiding plate for improving the illumination intensity on the solar cell. Under the effect of the light guiding plate, the light can be transmitted and concentrated to irradiate the solar cell, which facilitates high photo-voltaic efficiency of the solar cell.

However, the configuration of the solar cell on the sidewall of the light guiding plate requires the thickness of the light guiding plate to be identical to the width of the light receiving area of the solar cell. Accordingly, thin volume of the device can not be accomplished and the compact volume of a product is not liable to be achieved.

SUMMARY OF THE INVENTION

The invention directs to a light collection module conducive to an enhancement of the light energy received by the solar energy receiving element.

The invention is directed to a solar energy device having desirable photo-voltaic efficiency.

The invention provides a light collection module including a light guiding material and at least one solar energy receiving element. The light guiding material has a first surface and a second surface opposite to each other and the light guiding material includes at least one first light guiding structure and at least one second light guiding structure. The first light guiding structure is configured on the first surface and defines a first area in the light guiding material. The first light guiding structure includes a first light guiding surface and a first auxiliary surface connected with each other. The first light guiding surface and the first auxiliary surface are intersected in a first angle and a tip of the first angle is pointed to the inner portion of the light guiding material. The second light guiding structure is configured on the first surface and defines a second area in the light guiding material while the first area and the second area are alternatively arranged. The second light guiding structure includes a second light guiding surface and a second auxiliary surface. The second light guiding surface and the second auxiliary surface are intersected in a second angle. A tip of the second angle is pointed to the inner portion of the light guiding material and the inclination direction of the first light guiding surface is opposite to the inclination direction of the second light guiding surface. The solar energy receiving element is disposed on at least one of the first surface and the second surface of the light guiding material, wherein the solar energy receiving element is located at a third area outside of the first area and the second area.

The invention further provides a solar energy device including a substrate and the aforesaid light collection module, wherein the light guiding material is disposed on the substrate through an optical glue.

In light of the foregoing descriptions, the light guiding surfaces in different areas of the light guiding material have different inclination directions so that most incident light is restricted in the light guiding material. Accordingly, the solar energy receiving element disposed on the light guiding material receives most of the incident light. In addition, the solar energy receiving element is not configured on the sidewall of the light guiding material so that the thickness of the light guiding material is not limited to the width of solar energy receiving element, which conduces to achievement of the thin volume design.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
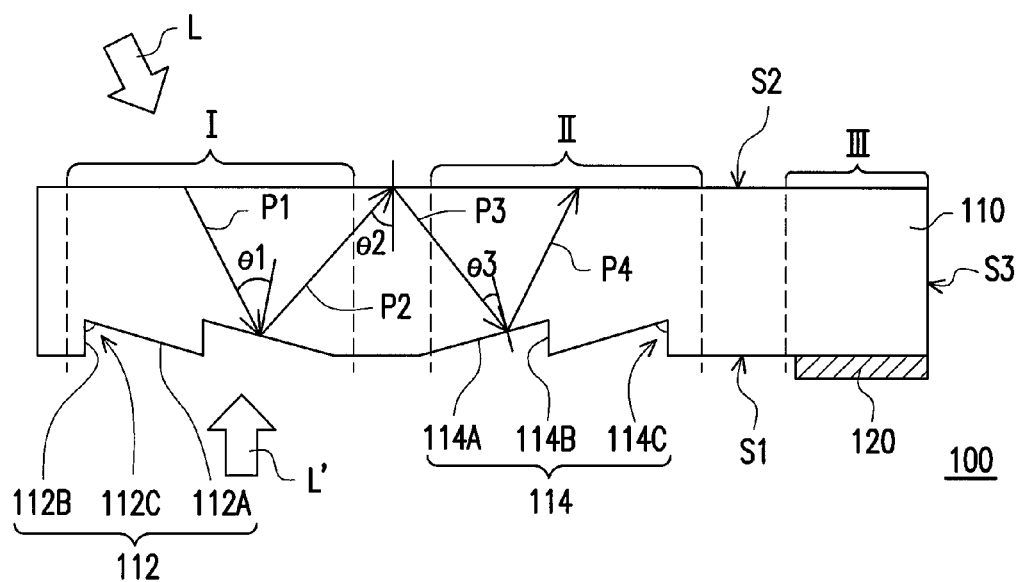
FIG. 1 schematically illustrates a cross-sectional view of a light collection module according to an embodiment of the invention.

FIG. 1 schematically illustrates a cross-sectional view of a light collection module according to an embodiment of the invention. Referring to FIG. 1, a light collection module 100 includes a light guiding material 110 and at least one solar energy receiving element 120. The light guiding material 110 has a first surface S1 and a second surface S2 opposite to each other and the light guiding material 110 includes at least one first light guiding structure 112 and at least one second light guiding structure 114. In specific, the first light guiding structure 112 is configured on the first surface S1 and defines a first area I in the light guiding material 110. The second light guiding structure 114 is configured on the first surface S1 and defines a second area II in the light guiding material 110. The solar energy receiving element 120 is disposed on at least one of the first surface S1 and the second surface S2 of the light guiding material 110, wherein the solar energy receiving element 120 is located at a third area III outside of the first area I and the second area II.

In the present embodiment, one first area I and one second area II are exemplarily described but the numbers of the first area I and the second area II can respectively be multiple in other embodiments, wherein the multiple first areas I and the multiple second areas II are alternatively arranged. Furthermore, the third area III can be substantially configured at the periphery of the light guiding material 110. The light L can be transmitted inside the light guiding material 110 through the second surface S2 so as to irradiate the solar energy receiving element 120. In this embodiment, the solar energy receiving element 120 is disposed on the first surface S1 but not on the side surface S3. Accordingly, the thickness of the light guiding material 110 is not restricted by the size of the solar energy receiving element 120 and thus can be smaller than 1 mm, for example. The light collection module 100 can have a thin volume and facilitate the application in a thin-volume electronic device.

The first light guiding structure 112 includes a first light guiding surface 112A and a first auxiliary surface 112B connected with each other. The first light guiding surface 112A and the first auxiliary surface 112B are intersected in a first angle 112C. A tip of the first angle 112C is pointed to the inner portion of the light guiding material 110 and the first angle 112C can be from 60 degrees to 89 degrees. The second light guiding structure 114 includes a second light guiding surface 114A and a second auxiliary surface 114B connected with each other. The second light guiding surface 114A and the second auxiliary surface 114B are intersected in a second angle 114C. A tip of the second angle 114C is pointed to the inner portion of the light guiding material 110 and the second angle 114C can be from 60 degrees to 89 degrees. A width of the first light guiding surface 112A can be larger than a width of the first auxiliary surface 112A and similarly, a width of the second light guiding surface 114A can be greater than a width of the second auxiliary surface 114B. In the present embodiment, the first light guiding surface 112A and the second light guiding surface 114A can be smooth surfaces or rough surfaces. In addition, the inclination direction of the first light guiding surface 112A is opposite to the inclination direction of the second light guiding surface 114A.

A material of the light guiding material 110 can be transparent polymer material such as an acrylic material (e.g. PMMA). The light L can be transmitted along the light path P1 in the light guiding material 110 owing to the inconsistent refractive indexes of the light guiding material 110 and the air. Based on the refractions of the materials, the light L transmitted along the light path P1 can be restricted in the light guiding material 110 and further transmitted along the light path P2 when the light L irradiates the first light guiding surface 112A in an incident angle θ1 larger than the total reflection critical angle. Similarly, the light L transmitted along the light path P2 can be totally reflected and further transmitted along the light path P3 as long as the incident angle θ2 of the light L irradiating on the second surface S2 is larger than the total reflection critical angle, wherein the light path P3 is more parallel to the horizontal direction than the light path P1. That is to say, the light L can be subjected to multiple times of total reflection effects provided by the first light guiding surface 112A and then substantially emitted from the light guiding material 110 along the horizontal direction or along a direction almost parallel to horizontal direction. As such, the solar energy receiving element 120 disposed on the first surface S1 of the light guiding material 110 can not efficiently receive the light L.

However, the second light guiding surface 114A in the second light guiding structure 114 has the inclination direction opposite to the inclination direction of the first light guiding surface 112A in the present embodiment. The light L transmitted along the light path P3 can be totally reflected and further transmitted along the light path P4 as long as the incident angle θ3 of the light L irradiating on the second light guiding surface 114A is larger than the total reflection critical angle. Herein, the light path P4 is away from the horizontal direction relative to the light path P3.

Therefore, the light L entering the light guiding material 110 from the second surface S2 can be transmitted in a direction away from the horizontal direction by the total reflection effects provided by the first light guiding structure 112 and the second light guiding structure 114. The light L can mostly irradiate the solar energy receiving element 120. When the solar energy receiving element 120 is a solar cell, the design of the present embodiment facilitates the enhancement of the photo-voltaic efficiency of the solar cell. Under the irradiation of the light L having identical intensity, the solar energy receiving element 120 can receive more solar energy due to the configuration of the light guiding material 110. Nevertheless, the light L in the invention is not limited to enter the light guiding material 110 through the second surface S2. In an alternative embodiment, the light L' transmitted inside the light guiding material 110 through the first surface S1 can efficiently irradiate the solar energy receiving element 120 because of the total reflection effects provided by the first light guiding structure 112 and the second light guiding structure 114.

Figure 2:
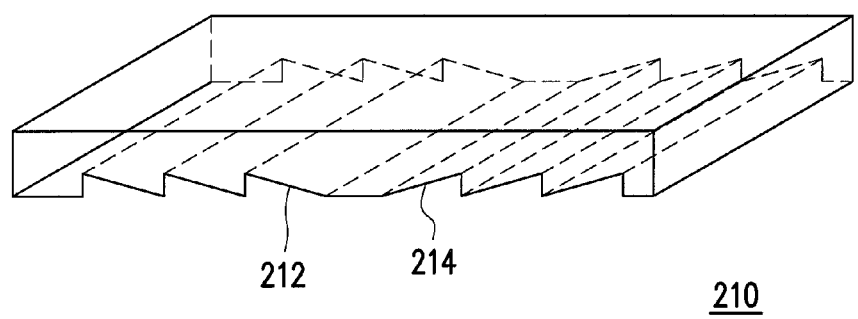
FIGS. 2 and 3 are schematic views of two light guiding materials according to two embodiments of the invention.
Figure 3:
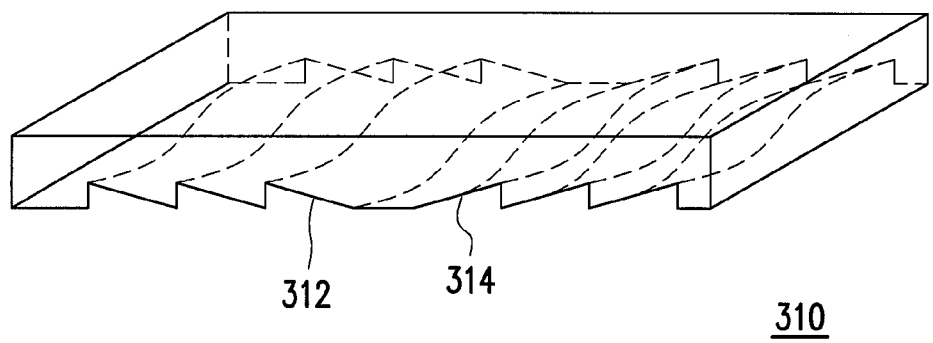

FIGS. 2 and 3 are schematic views of two light guiding materials according to two embodiments of the invention. As shown in FIG. 2, the first light guiding structures 212 and the second light guiding structures 214 of the light guiding material 210 can have the pattern of straight bars. As shown in FIG. 3, the first light guiding structures 312 and the second light guiding structures 314 of the light guiding material 310 can have the pattern of bended bars. That is to say, the first light guiding structures 312 and the second light guiding structures 314 can respectively have a wavy pattern or a zigzag pattern in the top view. No matter the pattern of the light guiding structures in the top view, the light guiding structures having light guiding surfaces inclining in different direction can comply with the scope of the invention and facilitate the enhancement of the light receiving efficiency of the light collection module.

Figure 4:
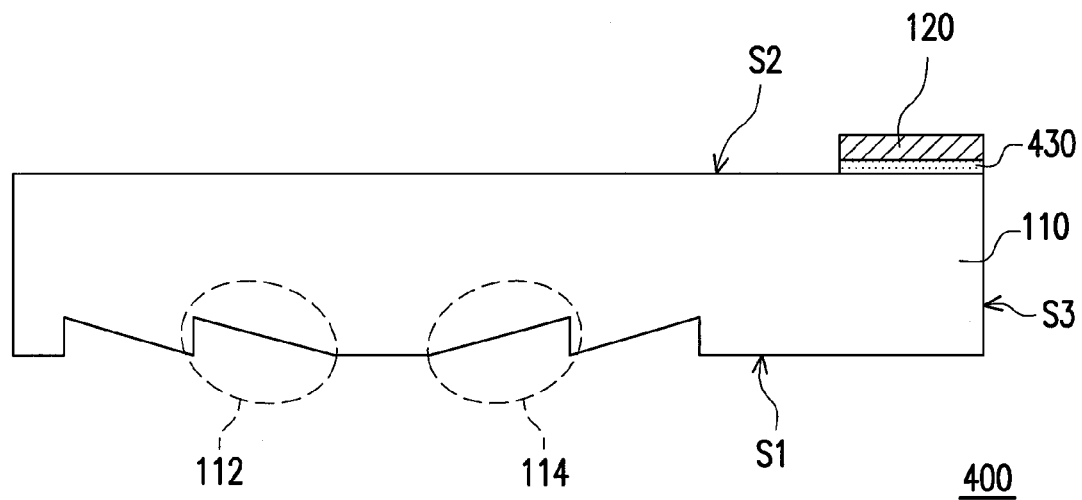
FIG. 4 schematically illustrates a cross-sectional view of a light collection module according to another embodiment of the invention.

FIG. 4 schematically illustrates a cross-sectional view of a light collection module according to another embodiment of the invention. Referring to FIG. 4, a light collection module 400 includes a light guiding material 110, a solar energy receiving element 120, and an optical glue 430, wherein the optical glue 430 is used for connecting the light guiding material 110 and the solar energy receiving element 120. In the present embodiment, the structure designs, the materials, and the properties of the light guiding material 110 and the solar energy receiving element 120 are the same as those described in the first embodiment. However, the difference between the present embodiment and the first embodiment lies in that the solar energy receiving element 120 according to the present embodiment is disposed on the second surface S2 of the light guiding material 110 through the optical glue 430.

Figure 5:
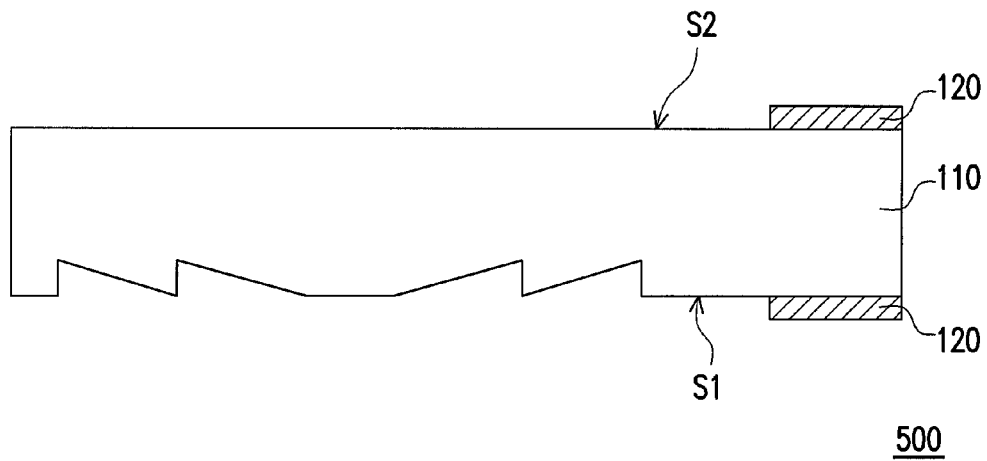
FIG. 5 schematically illustrates a cross-sectional view of a light collection module according to further another embodiment of the invention.

That is to say, the solar energy receiving element 120 is not particularly restricted to be disposed on the first surface S1 or on the second surface S2 in the invention. FIG. 5 schematically illustrates a cross-sectional view of a light collection module according to further another embodiment of the invention. As shown in FIG. 5, the light collection module 500 can include two solar energy receiving elements 120 respectively disposed on the first surface S1 and the second surface S2 of the light guiding material 110. As a whole, the solar energy receiving element 120 in the invention can be selectively disposed on at least one of the first surface S1 and the second surface S2 of the light guiding material 110.

Figure 6:
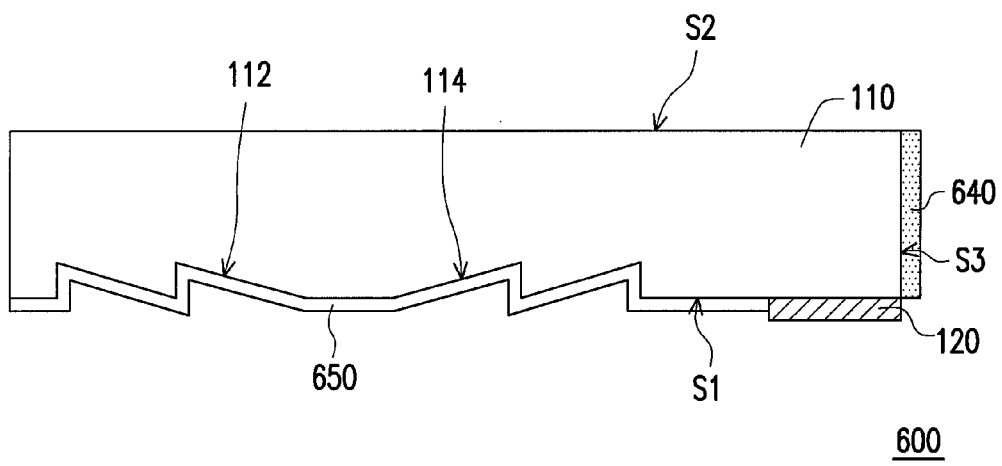
FIG. 6 schematically illustrates a cross-sectional view of a light collection module according to still further another embodiment of the invention.

FIG. 6 schematically illustrates a cross-sectional view of a light collection module according to still further another embodiment of the invention. Referring to FIG. 6, a light collection module 600 further includes a reflective layer 640 and a coating layer 650 in addition to the light guiding material 110 and the at least one solar energy receiving element 120 depicted in FIG. 1. The reflective layer 640 is disposed on the side surface S3 of the light guiding material 110 and the side surface S3 is a portion of the surface of the light guiding material 110 connected between the first surface S1 and the second surface S2. The coating layer 650 is disposed on the first surface S1 of the light guiding material 110 and covers the first light guiding structure 112 and the second light guiding structure 114.

Under the disposition of the reflective layer 640, the light entering the light guiding material 110 is not emitted from the side surface S3 so as to increase the probability that the light irradiates the solar energy receiving element 120. Accordingly, the disposition of the reflective layer 640 is conducive to an enhancement of the light energy received by the solar receiving element 120. Furthermore, the material of the coating layer 650 can be a hard material having high resistance of scraping and grinding so that the coating layer 650 can be a hard coating layer. Under the protection of the coating layer 650, the first light guiding structure 112 and the second light guiding structure 114 can be prevented from being damaged. If the coating layer 650 is made of a reflective material, the coating layer 650 is a reflective coating layer and the light collection module 600 can be applied in an opaque device. Herein, the reflective coating layer is help for improving the light collection efficiency of the light guiding material 110.

Figure 7:
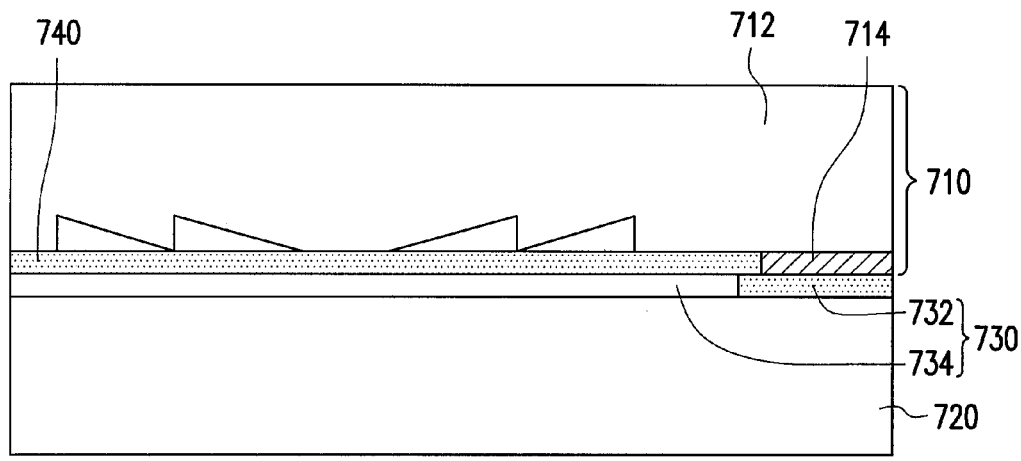
FIG. 7 is a schematic view of a solar energy device according to an embodiment of the invention.

FIG. 7 is a schematic view of a solar energy device according to an embodiment of the invention. Referring to FIG. 7, a solar energy device 700 includes a light collection module 710, a substrate 720, a decoration layer 730, and an optical glue 740. The light collection module 710 can be selected from one of the light collection modules 100, 400, 500, 600 as described in the above embodiments. The light collection module 710 includes a light guiding material 712 and at least one solar energy receiving element 714. The light guiding material 712 can be adhered on the substrate 720 through the optical glue 740 and the refractive index of the optical glue 740 is between those of the substrate 720 and the light guiding material 712.

In the present embodiment, the light guiding material 712 can be a thin film-like element, and the substrate 720 may be, for example, a glass substrate or a plastic substrate. It is noted that the light guiding material 712 can have the characteristic of flexibility and be disposed on the substrate 720 with adherence. In an example, the substrate 720 can be the window glass, the ceramic tile, or the like configured on a building or a car. The substrate 720 can further be the supporting substrate of a display panel, a touch panel, a touch display panel in an electronic device. That is to say, the collection module 710 can be applied in a building, an electronic device, vehicles, or other field.

In an embodiment, the substrate 720 can be selectively disposed with a decoration layer 730 when the light collection module 710 is applied in an electronic device. The decoration layer 730 can includes a decoration pattern 732 and a transparent layer 734, wherein the location of the decoration pattern 732 can be corresponding to the location of the solar energy receiving element 714 and the material of the decoration pattern 732 can be diamond-like carbon, ink, etc. When the electronic product is a display panel, the decoration pattern 732 can shade the opaque elements disposed therein and beautify the appearance of the product. In other words, the solar energy receiving element 714 is configured in the location of non-display area and has no negative influence on the display area of the electronic product when the electronic product is a display panel. Therefore, the electronic product with the light collection module 710 can have desirable display area. In addition, according to the foregoing embodiments, the light collection module 710 has the thin volume so that the volume of the electronic device is not largely increased.

Figure 8:
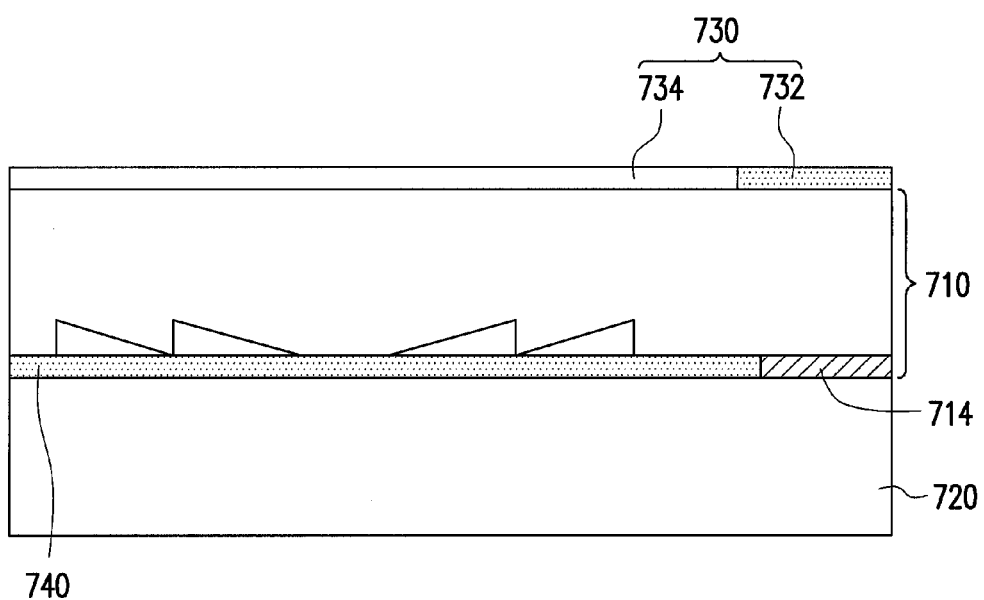
FIG. 8 is a schematic view of a solar energy device according to another embodiment of the invention.

FIG. 8 is a schematic view of a solar energy device according to another embodiment of the invention. Referring to FIG. 8, a solar energy device 800 includes the components of the solar energy device 700 such as a light collection module 710, a substrate 720, a decoration layer 730, and an optical glue 740. Nevertheless, in the present embodiment, the decoration layer 730 and the substrate 720 are respectively disposed on two opposite sides of the light collection module 710. Therefore, the spirit and the scope of the invention should not be limited by the disposition location of the decoration layer 730.

Figure 9:
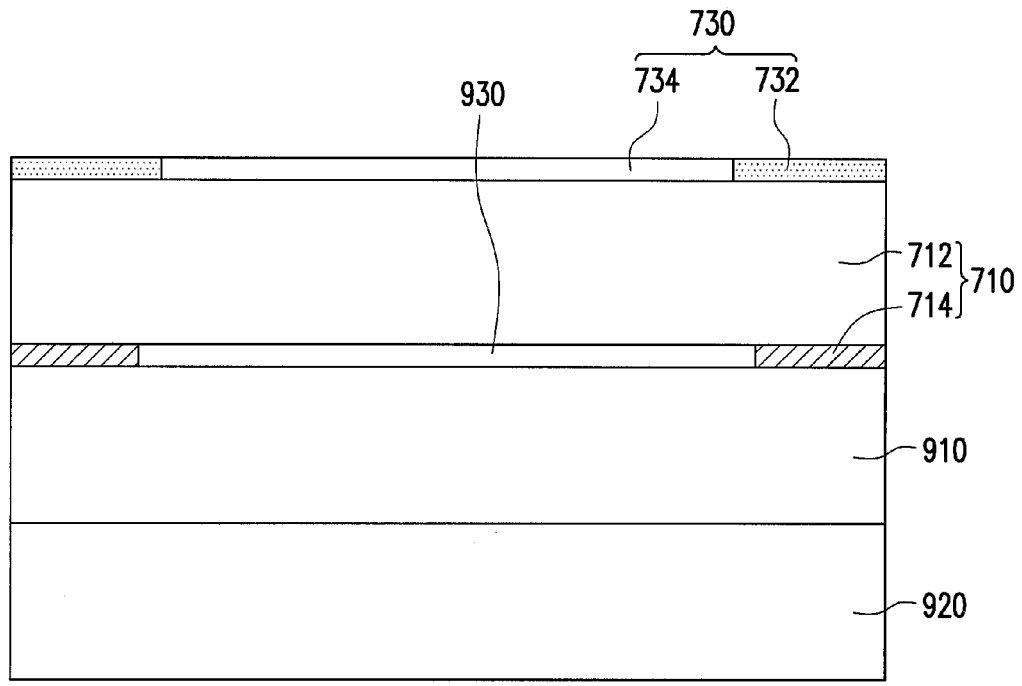
FIG. 9 is a schematic view of a portable electronic device according to an embodiment of the invention.

FIG. 9 is a schematic view of a portable electronic device according to an embodiment of the invention. Referring to FIG. 9, a portable electronic device 900 includes a touch panel 910, a display panel 920, the above-mentioned light collection module 710, and the above-mentioned decoration layer 730. The light collection module 710 and the decoration layer 730 can be referred to the foregoing description and not repeated here. The touch panel 910 is configured between the light collection module 710 and the display panel 920. In addition, an optical glue 930 can be used for adhering the light collection module 710 and the touch panel 910. In other embodiments, the touch panel 910 and the display panel 920 can be integrated or assembled with adherence.

Figure 10:
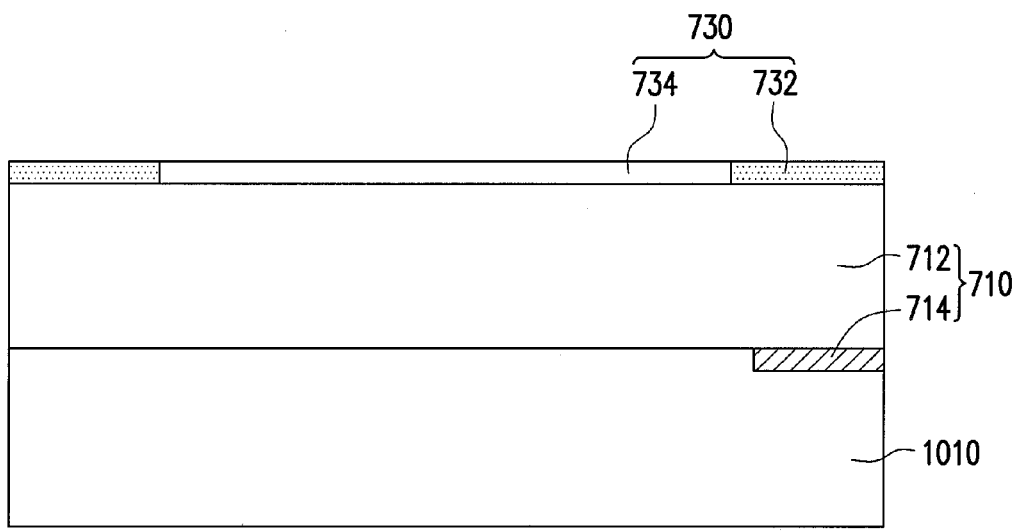
FIG. 10 is a schematic view of a portable electronic device according to another embodiment of the invention.

FIG. 10 is a schematic view of a portable electronic device according to another embodiment of the invention. Referring to FIG. 10, a portable electronic device 1000 includes a display panel 1010, the above-mentioned light collection module 710, and the above-mentioned decoration layer 730. The light collection module 710 and the decoration layer 730 can be referred to the aforesaid description and not repeated here. In specific, the solar energy receiving element 714 of the light collection module 710 can be configured on the display panel 1010 to achieve the thin volume design.

In view of the above, the light guiding material is configured with different light guiding structures having inconsistent inclination directions according to the invention. The light can be transmitted in the light guiding material along a direction away from the horizontal direction. Accordingly, the solar energy receiving element is not disposed on the side surface of the light guiding material in an embodiment and have desirable light receiving efficiency. Furthermore, most light entering the light guiding material can irradiate the solar energy receiving element such that the light collection module and the solar energy device according to the invention can have good photo-voltaic efficiency.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A light collection module comprising:
   a light guiding material having a first surface and a second surface opposite to each other and the light guiding material comprising:
   at least one first light guiding structure configured on the first surface to define a first area in the light guiding material, the first light guiding structure comprising a first light guiding surface and a first auxiliary surface connected with and asymmetric to each other, the first light guiding surface and the first auxiliary surface being intersected in a first angle, and a tip of the first angle pointing to the inner portion of the light guiding material;
   at least one second light guiding structure configured on the first surface to define a second area in the light guiding material, the first area and the second area being alternatively arranged, the second light guiding structure comprising a second light guiding surface and a second auxiliary surface connected with and asymmetric to each other, the second light guiding surface and the second auxiliary surface being intersected in a second angle, tip of the second angle pointing to the inner portion of the light guiding material, and an inclination direction of the first light guiding surface being opposite to an inclination direction of the second light guiding surface; and
   at least one solar energy receiving element disposed on at least one of the first surface and the second surface of the light guiding material, wherein the solar energy receiving element is located at a third area outside of the first area and the second area and the third area is located at a periphery of the light guiding material wherein the second area is disposed between the first area and the third area;
   wherein the first area is configured to transmit a light beam in a first path more parallel to the second surface than a corresponding incident path, and the second area is configured to transmit the light beam in a second path less parallel to the second surface than another corresponding incident path.

2. The light collection module as claimed in claim 1, further comprising a reflective layer disposed at a side surface of the light guiding material and the side surface being connected between the first surface and the second surface.

3. The light collection module as claimed in claim 1, further comprising an optical glue disposed between the light guiding material and the solar energy receiving element such that the light guiding material and the solar energy receiving element are connected.

4. The light collection module as claimed in claim 1, further comprising a hard coating layer disposed on the first surface of the light guiding material and covering the first light guiding structure and the second light guiding structure.

5. The light collection module as claimed in claim 1, wherein the first angle and the second angle are from 60 degrees to 89 degrees.

6. The light collection module as claimed in claim 1, further comprising a reflective coating layer applied on the first surface of the light guiding material and covering the first light guiding structure and the second light guiding structure.

7. A solar energy device, comprising:
   a substrate; and
   the light collection module as claimed in claim 1, wherein the light guiding material is disposed on the substrate through an optical glue.

8. The solar energy device as claimed in claim 7, wherein the substrate comprises a glass substrate or a polymer substrate.

9. The solar energy device as claimed in claim 7, wherein a refractive index of the optical glue is between a refractive index of the substrate and a refractive index of the light guiding material.

10. The solar energy device as claimed in claim 7, further comprising a decoration pattern disposed on the substrate or the light guiding material wherein the solar energy receiving element is corresponding to the decoration pattern.

* * * * *